(12) United States Patent
Daio et al.

(10) Patent No.: US 7,459,971 B2
(45) Date of Patent: Dec. 2, 2008

(54) AMPLIFIER CIRCUIT

(75) Inventors: Katsuhisa Daio, Kagoshima (JP);
Tomoyuki Hiro, Kagoshima (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/878,200

(22) Filed: Jul. 23, 2007

(65) Prior Publication Data

US 2008/0024212 A1 Jan. 31, 2008

Related U.S. Application Data

(63) Continuation of application No. 11/175,374, filed on Jul. 7, 2005, now Pat. No. 7,265,624.

(30) Foreign Application Priority Data

Jul. 13, 2004 (JP) ............................ 2004-206492

(51) Int. Cl.
*H03F 1/36* (2006.01)
(52) U.S. Cl. ........................................ 330/82; 330/104
(58) Field of Classification Search ......... 330/259–260, 330/85, 101–104
See application file for complete search history.

(56) References Cited

U.S. PATENT DOCUMENTS 5,684,433 A    11/1997 Madni et al.
6,720,830 B2    4/2004 Andreou et al.
6,825,724 B2 *  11/2004 Jaussi .......................... 330/260

FOREIGN PATENT DOCUMENTS

| JP | 57-030408   | 2/1982  |
|----|-------------|---------|
| JP | 60-149232   | 8/1985  |
| JP | 61-049506   | 3/1986  |
| JP | 02-206206   | 8/1990  |
| JP | 05-175754   | 7/1993  |
| JP | 11-506580   | 6/1999  |
| JP | 2001-223546 | 8/2001  |
| JP | 2001-274640 | 10/2001 |
| JP | 2003-283266 | 10/2003 |

OTHER PUBLICATIONS

Japanese Office dated Nov. 20, 2007 for Japanese Patent Application Action No. 2004-206492.

* cited by examiner

*Primary Examiner*—Robert Pascal
*Assistant Examiner*—Hieu P Nguyen
(74) *Attorney, Agent, or Firm*—Rader Fishman & Grauer PLLC; Ronald P. Kananen

(57) ABSTRACT

The present invention provides an amplifier circuit comprising a differential amplifier and a negative feedback loop circuit, in which a positive feedback loop circuit having a gain smaller than a gain of the negative feedback loop circuit is formed inside the negative feedback loop circuit.

4 Claims, 4 Drawing Sheets

AMPLIFIER CIRCUIT

CROSS REFERENCE TO RELATED APPLICATIONS

The present application is a Continuation Application of the patent application Ser. No. 11/175,374, filed Jul. 7, 2005, which in turn claims priority from Japanese applications No. 2004-206492 filed on Jul. 13, 2004, the entire contents of which are incorporated herein by reference.

BACKGROUND OF THE INVENTION

1. Field of the Invention

The present invention relates to an amplifier circuit.

2. Description of Related Art

In the past, in a case where a differential amplifier was used as an amplifier circuit, due to slightly different properties of the transistors constituting a differential pair, there was a defect that a certain level of offset voltage was generated between output terminals of the differential amplifier, although there was no voltage difference between input terminals.

The amplifier circuit, therefore, is designed such that a negative feedback loop circuit is connected to a differential amplifier, and that by this negative feedback loop circuit, the offset voltage of the differential amplifier is amplified and fed back to the differential amplifier, so that the offset voltage of the differential amplifier is cancelled (e.g. refer to Patent Document 1).

Specifically, as illustrated in FIGS. 3 and 4, in an amplifier circuit 101, a low pass filter circuit 103 is connected to a differential amplifier 102, a buffer circuit 104 is connected to the low pass filter 103, and the buffer circuit 104 is connected to the differential amplifier 102, so that these low pass filter circuit 103 and buffer circuit 104 form a negative feedback loop circuit 105. In the figures, reference numerals 108, 109 denote input terminals of the amplifier circuit 101 and reference numerals 110, 111 denote output terminals of the amplifier circuit 101.

The low pass filter circuit 103 is constituted by a negative feedback amplifier 106 having a certain level of gain and a capacitor 107 connected in parallel between output terminals of the negative feedback amplifier 106.

In the amplifier circuit 101 having the above-described configuration, the low pass filter circuit 103 allows only a DC offset voltage to be amplified to a multiple of the gain of the negative feedback amplifier 106, without affecting a high-frequency component of an output signal of the differential amplifier 102, and to be fed back to the differential amplifier 102 via the buffer circuit 104.

[Patent Document 1]

Published Japanese Patent Application (KOKAI) No. 2003-283266

SUMMARY OF THE INVENTION

Thus, in the above-described, related-art amplifier circuit 101, a feedback amount that is to be fed back to the differential amplifier 102 by the negative feedback loop circuit 105 is determined by only the gain of the negative feedback amplifier 106.

Therefore, in the related-art amplifier circuit 101, since there is a limit on the feedback amount of the negative feedback loop circuit 105 due to a limit value of the gain of the negative feedback amplifier 106, the offset voltage can be cancelled only to a certain extent.

According to a first embodiment of the present invention, in an amplifier circuit which comprises a differential amplifier and a negative feedback loop circuit, a positive feedback loop circuit having a smaller gain than a gain of the negative feedback loop circuit is formed inside the negative feedback loop circuit.

The first embodiment of the presenting invention may be modified so that the gain of the positive feedback loop circuit is determined in conjunction with the gain of the negative feedback loop circuit.

It may be modified further so that the gain of the positive feedback loop circuit is determined using some of the resistors for determining the gain of the negative feedback loop circuit.

Furthermore, according to another embodiment of the present invention, in an amplifier circuit which comprises a differential amplifier and an offset voltage canceling the negative feedback loop circuit, a positive feedback loop circuit is formed inside of the negative feedback loop circuit, the positive feedback loop circuit having a smaller gain than a gain of the negative feedback loop circuit.

It may be modified so that the gain of the positive feedback loop circuit is determined in conjunction with the gain of the negative feedback loop circuit.

It may be further modified so that the gain of the above-mentioned positive feedback loop circuit is determined using some of the resistors for determining the gain of the above-mentioned negative feedback loop circuit.

According to the present invention, since in an amplifier circuit which comprises a differential amplifier and a negative feedback loop circuit, a positive feedback loop circuit having a smaller gain than a gain of the negative feedback loop circuit is formed inside of the negative feedback loop circuit, the gain of the positive feedback loop circuit can increase a feedback amount by the negative feedback loop circuit, so that the offset voltage of the differential amplifier can be cancelled favorably. In addition, since the gain of the positive feedback loop circuit is made smaller than the gain of the negative feedback loop circuit, the offset voltage can be cancelled without oscillating the amplifier circuit.

Furthermore, according to the present invention, since the gain of the positive feedback loop circuit is determined in conjunction with the gain of the negative feedback loop circuit, the gain of the positive feedback circuit can be constantly smaller than the gain of the negative feedback loop circuit, and thus, the offset voltage can be cancelled without oscillating the amplifier circuit.

Still further, according to the present invention, since the gain of the positive feedback loop circuit is determined using some of the resistors for determining the gain of the negative feedback loop circuit, an increase in the circuit size of the amplifier circuit can be prevented.

Still further, according to the present invention, since in an amplifier circuit which comprises a differential amplifier and an offset voltage canceling negative feedback loop circuit, a positive feedback loop circuit having a smaller gain than a gain of the negative feedback loop circuit is formed inside the negative feedback loop circuit, the gain of the positive feedback loop circuit can increase a feedback amount due to the negative feedback loop circuit, so that the offset voltage of the differential amplifier can be cancelled favorably. In addition, since the gain of the positive feedback loop circuit is made smaller than the gain of the negative feedback loop circuit, the offset voltage can be cancelled without oscillating the amplifier circuit.

Still further, according to the present invention, since the gain of the positive feedback loop circuit is determined in conjunction with the gain of the negative feedback loop circuit, the gain of the positive feedback circuit can be constantly smaller than the gain of the negative feedback loop circuit, and thus the offset voltage can be cancelled without oscillating the amplifier circuit.

Still further, according to the present invention, since the gain of the positive feedback loop circuit is determined using some of the resistors for determining the gain of the negative feedback loop circuit, an increase in the circuit size of the amplifier circuit can be prevented.

DESCRIPTION OF THE PREFERRED EMBODIMENT

The present invention relates to an amplifier circuit for amplifying various signals.

The amplifier circuit is constituted so as to amplify a signal by a differential amplifier, and an offset cancel circuit for canceling an offset voltage of the differential amplifier is added. The offset cancel circuit is a negative feedback loop circuit canceling the offset voltage by amplifying and feeding back the offset voltage generated in the differential amplifier. Accordingly, the amplifier circuit of the present invention has a configuration in which the negative feedback loop circuit is connected to the differential amplifier.

In addition to the amplifier circuit according to the present invention, a positive feedback loop circuit inside the negative feedback loop circuit. The positive feedback loop circuit has a gain smaller than a gain of the negative feedback loop circuit.

Thus, in the present invention, since the positive feedback loop circuit having the smaller gain than the gain of the negative feedback loop circuit is formed inside the negative feedback loop circuit, the offset voltage of the differential amplifier is amplified so as to be fed back not only by the gain of the negative feedback loop circuit but also by the gain of the positive feed loop circuit.

In the present invention, therefore, a feedback amount by the negative feedback loop circuit can be increased, and the offset voltage of the differential amplifier can be cancelled favorably. In addition, since the gain of the positive feedback loop circuit is smaller than the gain of the negative feedback loop circuit, the offset voltage can be cancelled without oscillating the amplifier circuit, which can prevent a malfunction of the semiconductor device from occurring.

In particular, in a case where the gain of the positive feedback loop circuit is determined in conjunction with the gain of the negative feedback loop circuit, the gain of the positive feedback loop circuit can be constantly smaller than the gain of the negative feedback loop circuit, and thus the offset voltage can be cancelled without oscillating the amplifier circuit, which can prevent a malfunction of the semiconductor device from occurring.

Furthermore, in a case where the gain of the positive feedback loop circuit is determined using some of the resistors for determining the gain of the negative feedback loop circuit, an increase in circuit size of the amplifier circuit can be prevented, which can prevent an upsizing of the semiconductor device accompanying function addition.

Hereinafter, a specific configuration of the amplifier circuit according to the present invention is described with reference to the drawings. The amplifier circuit according to the present invention is incorporated into a semiconductor device mainly performing various signal processing, control and the like, and it is formed into a circuit on a semiconductor substrate.

Figure 1:
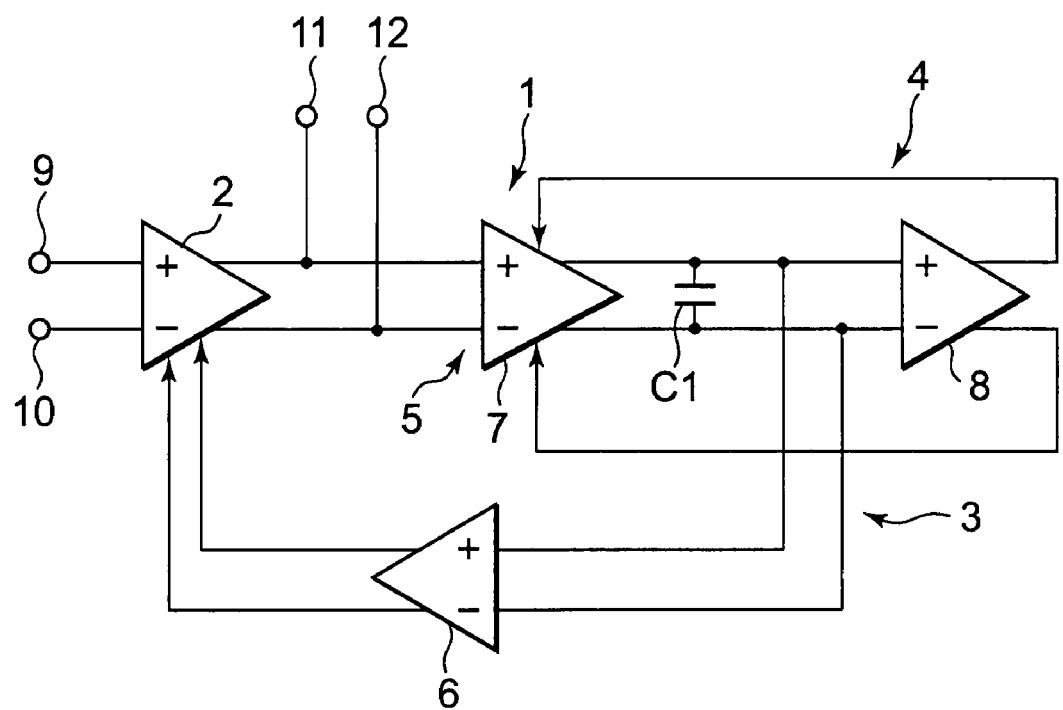
FIG. 1 is a block diagram showing an amplifier circuit according to the present invention.

In an amplifier circuit 1, as shown in FIG. 1, a negative feedback loop circuit 3 as an offset cancel circuit is connected to a differential amplifier 2, and inside the negative feedback loop circuit 3, there is formed a positive feedback loop circuit 4 having a gain Gp smaller than a gain Gn of the negative feedback loop circuit 3. In the figure, reference numeral 9 denotes a non-inversion input terminal of the amplifier circuit 1, reference numeral 10 denotes an inversion input terminal of the amplifier circuit 1, reference numeral 11 denotes a non-inversion output terminal of the amplifier circuit 1, and reference numeral 12 denotes an inversion output terminal of the amplifier circuit 1.

The negative feedback loop circuit 3 is formed in a closed loop by a low-pass filter circuit 5 and a buffer circuit 6. In this low-pass filter circuit 5, a capacitor C1 is connected in parallel between output terminals of a negative feedback amplifier 7 having the gain Gn.

Furthermore, in the positive feedback loop circuit 4, a positive feedback amplifier 8 having the gain Gp smaller than the gain Gn of the negative feedback amplifier 7 is connected to the negative feedback amplifier 7 in a closed loop.

In the amplifier circuit 1 having the above-described configuration, the low-pass filter circuit 5 allows only a DC offset voltage to be amplified at a gain determined according to the gain Gn of the negative feedback amplifier 7 and the gain Gp of the positive amplifier 8, without affecting a high-frequency component of an output signal of the differential amplifier 2 and to be fed back to the differential amplifier 2 via the buffer circuit 6.

Thus, in the amplifier circuit 1, the positive feedback loop circuit 4 having the gain Gp smaller than the gain Gn of the negative feedback loop circuit 3 is formed inside the negative feedback loop circuit 3.

Therefore, in the amplifier circuit 1, the offset voltage of the differential amplifier 2 is amplified not only by the gain Gn of the negative feedback loop circuit 3 but also by the gain Gp of the positive feedback loop circuit 4, and it is fed back to the differential amplifier 2.

Thereby, in the amplifier circuit 1, a feedback amount by the negative feedback loop circuit 3 can be increased, and the offset voltage of the differential amplifier 2 can be cancelled favorably. In addition, since the gain Gp of the positive feedback loop circuit 4 is smaller than the gain Gn of the negative feedback loop circuit 3, the offset voltage of the differential amplifier 2 can be cancelled without oscillating the amplifier circuit 1.

Figure 2:
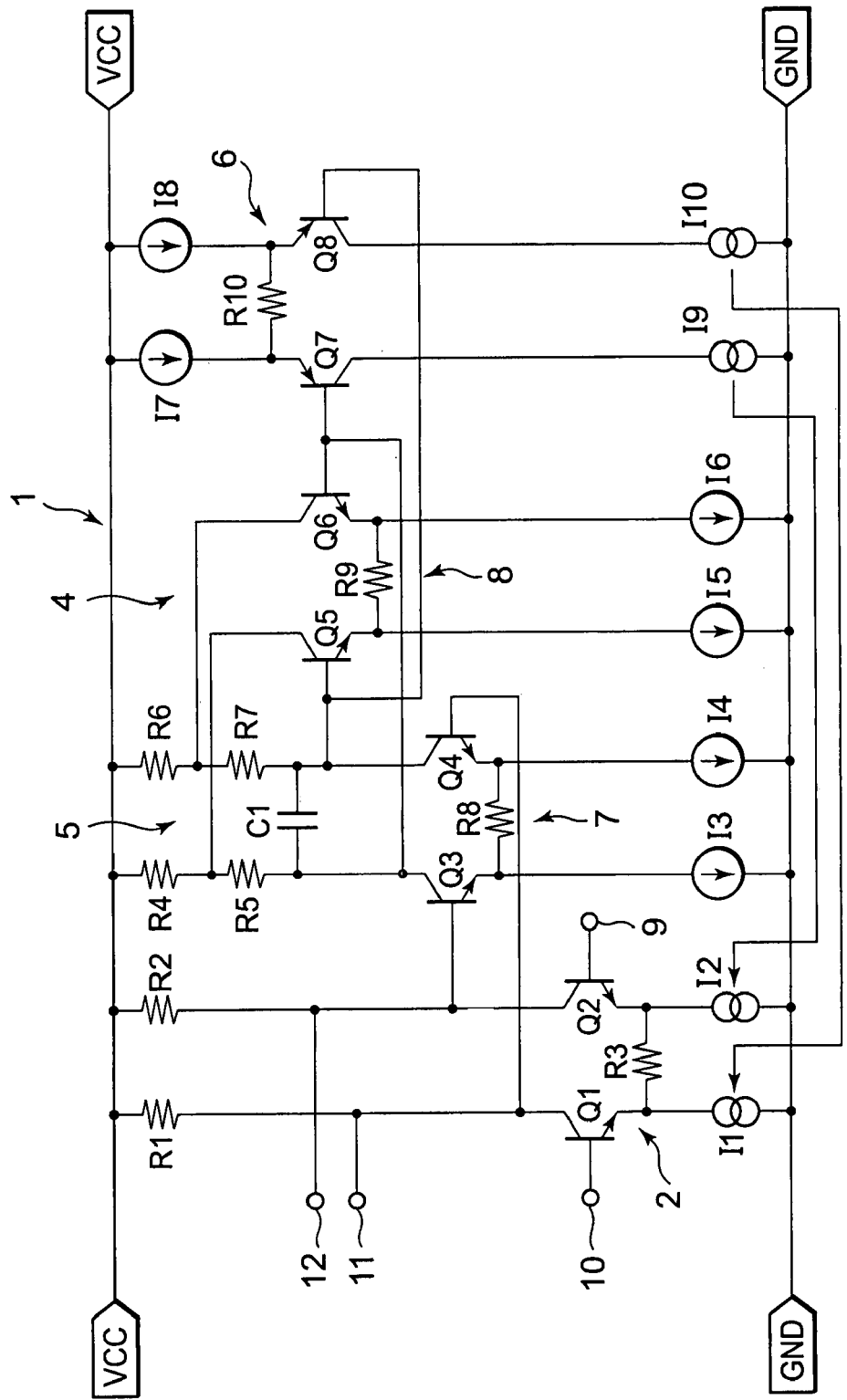
FIG. 2 is a circuit diagram of the amplifier circuit according to the present invention.
Figure 3:
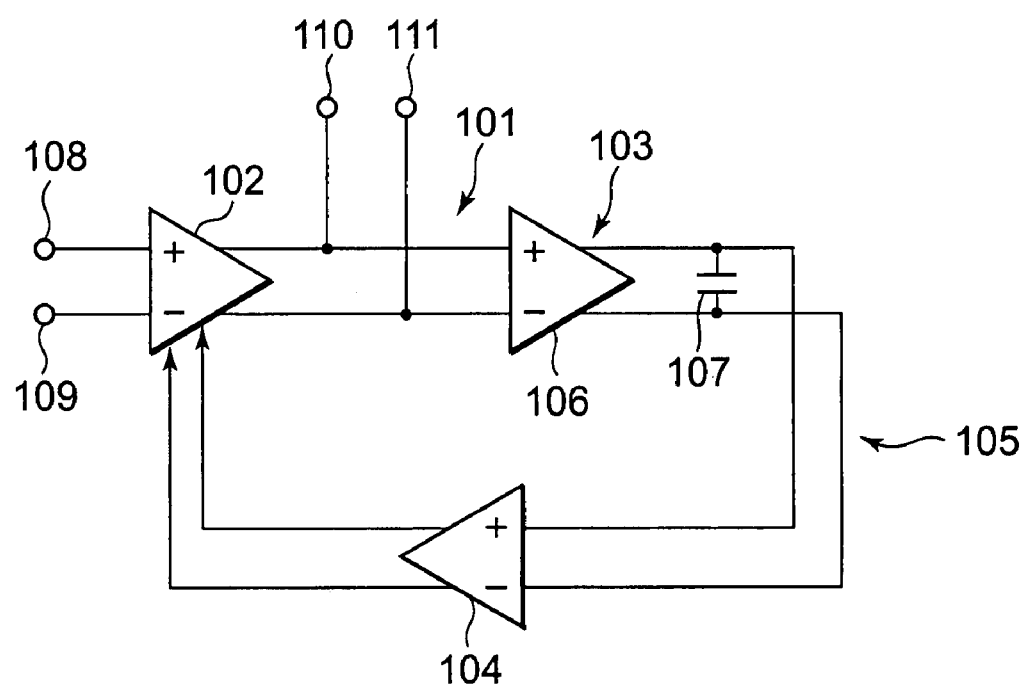
FIG. 3 is a block diagram showing a related art amplifier circuit.
Figure 4:
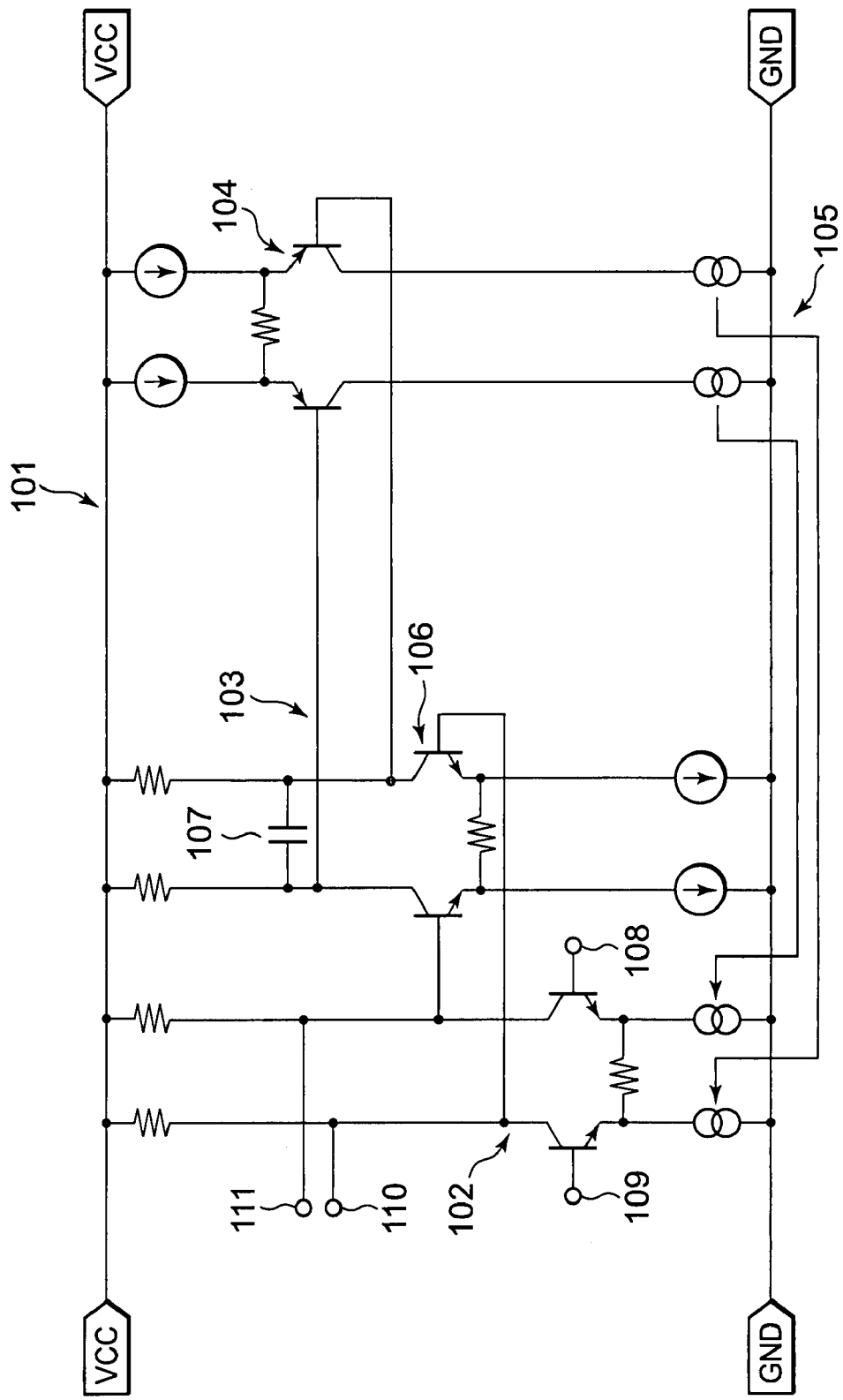
FIG. 4 is a circuit diagram of the related art amplifier circuit.

Hereinafter, for the amplifier circuit 1 having the above-described configuration, a circuit configuration is described that shows a specific circuit diagram (FIG. 2). The circuit diagram shown in FIG. 2 is merely one example of the amplifier circuit 1 having the above-described configuration, and other circuit configurations also may be employed.

The differential amplifier 2 of the amplifier circuit 1 connects a resistor R3 between emitters of npn-type transistors Q1, Q2 constituting a differential pair and connects resistors R1, R2 between a power supply terminal VCC and collectors of the transistors Q1, Q2, respectively, while connecting current sources I1, I2 between a ground terminal and the emitters of the transistors Q1, Q2.

Furthermore, the differential amplifier 2 connects the non-inversion input terminal 9 and the inversion input terminal 10 to bases of the transistors Q1, Q2, respectively, and connects the non-inversion output terminal 11 and the inversion output terminal 12 to the collectors of the transistors Q1, Q2, respectively.

The negative feedback amplifier 7 constituting the low-pass filter circuit 5 connects a resistor R8 between emitters of npn-type transistors Q3, Q4 constituting a differential pair and connects resistors R4, R5 and resistors R6, R7 connected in series between the power supply terminal VCC and collectors of the transistors Q3, Q4, respectively, while connecting constant current sources I3, I4 between the ground terminal and the emitters of the transistors Q3, Q4.

The negative feedback amplifier 7 connects the non-inversion output terminal 11 and the inversion output terminal 12 to bases of the transistors Q3, Q4, respectively.

The low-pass filter circuit 5 connects the capacitor C1 between the collectors of the transistors Q3, Q4.

The positive feedback amplifier 8 connects a resistor R9 between emitters of npn-type transistors Q5, Q6 constituting a differential pair and connects resistors R4, R6 between the power supply terminal VCC and collectors of the transistors Q5, Q6, respectively, while connecting constant current sources I5, I6 between the ground terminal and the emitters of the transistors Q5, Q6.

The positive feedback amplifier 8 connects the collectors of the transistors Q3, Q4 of the negative feedback amplifier 7 to bases of the transistors Q5, Q6, respectively.

The buffer circuit 6 connects a resistor R10 between emitters of pnp-type transistors Q7, Q8 constituting a differential pair and connects constant current sources I7, I8 between the power supply terminal VCC and the emitters of the transistors Q7, Q8, respectively, while connecting current sources I9, I10 between the power supply terminal VCC and collectors of the transistors Q7, Q8; and these current sources I9, I10 are subjected to a current-mirror connection to the current source I1, I2 of the differential amplifier 2.

Furthermore, the buffer circuit 6 connects the collectors of the transistors Q3, Q4 of the negative feedback amplifier 7 to bases of the transistors Q7, Q8, respectively.

The amplifier circuit 1 is constituted as described above, and the gain Gn of the negative feedback amplifier 7 is determined as follows.

If an offset voltage of the differential amplifier 2 is "$\Delta V$", a resistance between the base and the emitter of each of the transistors Q3, Q4 is "re", a resistance value of the resistor R8 is "r3", and a current flowing in the constant current sources I3, I4 is "i1", a changing current $\Delta i1$ generated by the offset voltage of the differential amplifier 2 is represented by the following formula (1):

$$\Delta i1 = \Delta V/(r3+2 \cdot re) \quad (1)$$

If a potential of the power supply terminal VCC is "Vcc", a resistance value of the resistors R4, R6 is "r1", and a resistance value of the resistors R5, R7 is "r2", a base potential Vb5 is represented by the following formula (2):

$$Vb5 = Vcc - (i1 - \Delta i1) \cdot (r1+r2) \quad (2)$$

Accordingly, the following formula (3) is derived from the formula (1):

$$Vb5 = Vcc - (i1 - \Delta V/(r3+2 \cdot re)) \cdot (r1+r2) \quad (3)$$

Similarly, a base potential Vb6 of the transistor Q6 is represented by the following formula (4):

$$Vb6 = Vcc - (i1+\Delta i1) \cdot (r1+r2) \quad (4)$$

Accordingly, the following formula (5) is derived from the formula (1):

$$Vb6 = Vcc - (i1-\Delta V/(r3+2 \cdot re)) \cdot (r1+r2) \quad (5)$$

An offset voltage $\Delta V5$ in the negative feedback amplifier 7, which is generated in the base of the transistor Q5, is represented by the following formula (6):

$$\Delta V5 = Vb5 - Vb6 \quad (6)$$

Accordingly, the following formula (7) is derived from the formulae (3) and (5):

$$\Delta V5 = 2 \cdot \Delta V \cdot (r1+r2)/(r3+2 \cdot re) \quad (7)$$

Consequently, the gain Gn of the negative feedback amplifier 7 is represented by the following formula (8):

$$Gn = \Delta V5/\Delta V \quad (8)$$

Accordingly, the following formula (9) is derived from the formula (8):

$$Gn = 2 \cdot (r1+r2)/(r3+2 \cdot re) \quad (9)$$

In the negative feedback amplifier 7, the resistance values of the resistors R4 to R8 are set so that the gain Gn is 1 or more.

Next, the gain Gp of the positive feedback amplifier 8 at the time when the offset voltage generated in the negative feedback amplifier 7 is $\Delta V5$ is determined as follows.

If a resistance between the base and the emitter of each of the transistors Q5, Q6 is "re", a resistance value of the resistor R9 is "r3", a current flowing in the constant current sources I5, I6 is "i2", a changing current $\Delta i2$ generated by the offset voltage of the negative feedback amplifier 7 is represented by the following formula (10):

$$\Delta i2 = \Delta V5/(r3+2 \cdot re) \quad (10)$$

The base potential Vb5 of the transistor Q5 is represented as follows:

$$Vb5 = Vcc - (i2 - \Delta i2) \cdot r1 \quad (11)$$

Accordingly, the following formula (12) is derived from the formula (10):

$$Vb5 = Vcc - (i2 - \Delta V5/(r3+2 \cdot re)) \cdot r1 \quad (12)$$

Similarly, the base potential Vb6 of the transistor Q6 is presented by the following formula (13):

$$Vb6 = Vcc - (i2+\Delta i2) \cdot r1 \quad (13)$$

Accordingly, the following formula (14) also is derived from the formula (10):

$$Vb6 = Vcc - (i2+\Delta V5/(r3+2 \cdot re)) \cdot r1 \quad (14)$$

In addition, the offset voltage $\Delta V5'$ after positive feedback, which is generated in the base of the transistor Q5, is represented by the following formula (15):

$$\Delta V5' = Vb5 - Vb6 \quad (15)$$

Consequently, the following formula (16) is derived from the formulae (12) and (14):

$$\Delta V5' = 2 \cdot \Delta V5 \cdot r4/(r3+2 \cdot re) \quad (16)$$

Accordingly, the gain Gp of the positive feedback amplifier 8 is represented by the following formula (17):

$$Gp = \Delta V5'/\Delta V5 \quad (17)$$

Accordingly, the following formula (18) is derived from the formula (16).

$$Gp=2 \cdot r1(r3+2 \cdot re) \qquad (18)$$

In the positive feedback amplifier 8, the resistance values of the resistors R4, R6, R9 are set so that the gain Gp is 1 or more.

In accordance with the formulae (9) and (18), the gain Gn of the negative feedback amplifier 7 and the gain Gp of the positive feedback amplifier 8 are represented by the following formula (19):

$$Gp=Gn \cdot r1/(r1+r2) \qquad (19)$$

Consequently, the gain Gp of the positive feedback amplifier 8 is smaller than the gain Gn of the negative feedback amplifier 7.

Thus, in the amplifier circuit 1, by forming the positive feedback loop circuit 4 having the gain Gp smaller than the gain Gn of the negative feedback loop circuit 3 inside the negative feedback loop circuit 3, the offset voltage of the differential amplifier 2 is amplified so as to be fed back to the differential amplifier 2 not only by the gain Gn of the negative feedback loop circuit 3 but also by the gain Gp of the positive feedback loop circuit 4.

Thereby, in the amplifier circuit 1, the feedback amount by the negative feedback loop circuit 3 can be increased and the offset voltage of the differential amplifier 2 can be favorably cancelled. In addition, since the gain Gp of the positive feedback loop circuit 4 is smaller than the gain Gn of the negative feedback loop circuit 3, the offset voltage can be cancelled without oscillating the amplifier circuit 1.

In addition, in the amplifier circuit 1, since the gain Gp of the positive feedback loop circuit 4 is determined using some of the resistors R4 to R7, i.e., the resistors R4, R6, for determining the gain Gn of the negative feedback loop circuit 3, an increase in circuit size of the amplifier circuit 1 can be prevented, which can prevent an upsizing of a semiconductor device having additional functions.

Furthermore, in the amplifier circuit 1, since the gain Gp of the positive feedback loop circuit 4 is determined using some of the resistors R4 to R7, i.e., the resistors R4, R6, for determining the gain Gn of the negative feedback loop circuit 3, the gain Gp of the positive feedback loop circuit 4 is determined in conjunction with the gain Gn of the negative feedback loop circuit 3.

Therefore, in the amplifier circuit 1, the gain Gp of the positive feedback loop circuit 4 can be constantly smaller than the gain Gn of the negative feedback loop circuit 3, and thus the offset voltage can be cancelled without oscillating the amplifier circuit 1, thereby preventing a malfunction of the semiconductor device from occurring.

The present document contains subject matter related to Japanese Patent Application JP 2004-206492 filed in the Japanese Patent Office on Jul. 13, 2004, the entire contents of which are incorporated herein by reference.

It should be understood by those skilled in the art that various modifications, combinations, subcombinations and alterations may occur depending on design requirements and other factors insofar as they are within the scope of the appended claims or the equivalents thereof.

What is claimed is:

1. An amplifier circuit comprising a differential amplifier and a negative feedback loop circuit, wherein:
   a positive feedback loop circuit having a gain smaller than a gain of said negative feedback loop circuit is formed inside the negative feedback loop circuit;
   the gain of the positive feedback loop circuit and the gain of the negative feedback loop circuit have a positive correlation; and
   the positive feedback loop circuit includes a positive feedback amplifier having a gain Gp, and the negative feedback loop circuit includes a negative feedback amplifier having a gain Gn.

2. The amplifier circuit as claimed in claim 1, wherein:
   the gain of said positive feedback loop circuit is determined in conjunction with the gain of said negative feedback loop circuit.

3. The amplifier circuit as claimed in claim 1, wherein the differential amplifier has an offset voltage amplified by the gain Gp and the gain Gn.

4. The amplifier circuit as claimed in claim 1, wherein the positive correlation is a linear correlation such that $Gp=Gn \times C_r$, where the $C_r$ is a constant value of less than 1.

* * * * *